US012663370B2

(12) United States Patent
Kraus et al.

(10) Patent No.: US 12,663,370 B2
(45) Date of Patent: Jun. 23, 2026

(54) METROLOGY APPARATUS AND METROLOGY METHODS BASED ON HIGH HARMONIC GENERATION FROM A DIFFRACTIVE STRUCTURE

(71) Applicant: ASML Netherlands B.V., Veldhoven (NL)

(72) Inventors: Peter Michael Kraus, Amsterdam (NL); Sylvianne Dorothea Christina Roscam Abbing, Utrecht (NL); Filippo Campi, Amsterdam (NL); ZhuangYan Zhang, Berlin (DE); Petrus Wilhelmus Smorenburg, Veldhoven (NL); Nan Lin, Eindhoven (NL); Stefan Michiel Witte, Hoofddorp (NL); Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 63 days.

(21) Appl. No.: 18/038,590

(22) PCT Filed: Oct. 12, 2021

(86) PCT No.: PCT/EP2021/078193
§ 371 (c)(1),
(2) Date: May 24, 2023

(87) PCT Pub. No.: WO2022/111905
PCT Pub. Date: Jun. 2, 2022

(65) Prior Publication Data
US 2024/0003809 A1　　Jan. 4, 2024

(30) Foreign Application Priority Data
Nov. 26, 2020　　(EP) .................................... 20209950

(51) Int. Cl.
*G01N 21/47* (2006.01)
*G01B 11/06* (2006.01)
*G03F 7/00* (2006.01)

(52) U.S. Cl.
CPC ..... *G01N 21/4788* (2013.01); *G01B 11/0608* (2013.01); *G03F 7/70625* (2013.01);
(Continued)

(58) Field of Classification Search
CPC ....... G01N 21/4788; G01N 2201/0634; G01B 11/0608; G03F 7/70625; G03F 7/706851;
(Continued)

(56) References Cited

U.S. PATENT DOCUMENTS 6,952,253 B2　10/2005　Lof et al.
6,961,116 B2　11/2005　Den Boef et al.
(Continued)

FOREIGN PATENT DOCUMENTS

CN　　101515105 B　　7/2010
EP　　1 628 164 A2　　2/2006
(Continued)

OTHER PUBLICATIONS

International Search Report and Written Opinion of the International Searching Authority directed to International Patent Application No. PCT/EP2021/078193, mailed Dec. 23, 2021; 8 pages.
(Continued)

*Primary Examiner* — Kara E. Geisel
(74) *Attorney, Agent, or Firm* — Finnegan, Henderson, Farabow, Garrett & Dunner LLP

(57) ABSTRACT
Disclosed is a metrology apparatus and method for measurement of a diffractive structure on a substrate. The metrology apparatus comprises a radiation source operable to provide first radiation for excitation of the diffractive structure such that high harmonic second radiation is gen-
(Continued)

(a)

(b)

erated from said diffractive structure and/or substrate; and a detection arrangement operable to detect said second radiation, at least a portion of which having been diffracted by said diffractive structure.

18 Claims, 5 Drawing Sheets

(52) U.S. Cl.
CPC .................. *G03F 7/706851* (2023.05); *G01N 2201/0634* (2013.01)

(58) Field of Classification Search
CPC . G03F 7/70616; G03F 7/7065; G03F 7/70633
See application file for complete search history.

(56) References Cited

U.S. PATENT DOCUMENTS

| | | |
|---|---|---|
| 7,265,364 B2 | 9/2007 | Teunissen et al. |
| 7,646,471 B2 | 1/2010 | Teunissen et al. |
| 7,701,577 B2 | 4/2010 | Straaijer et al. |
| 7,791,724 B2 | 9/2010 | Den Boef et al. |
| 8,115,926 B2 | 2/2012 | Straaijer |
| 8,553,227 B2 | 10/2013 | Jordanoska |
| 8,681,312 B2 | 3/2014 | Straaijer |
| 8,692,994 B2 | 4/2014 | Straaijer |
| 8,792,096 B2 | 7/2014 | Straaijer |
| 8,797,554 B2 | 8/2014 | Straaijer |
| 8,823,922 B2 | 9/2014 | Den Boef |
| 10,996,568 B2 | 5/2021 | Smorenburg et al. |
| 11,223,181 B2 | 1/2022 | Smorenburg et al. |
| 2007/0224518 A1 | 9/2007 | Yokhin et al. |
| 2010/0233600 A1 | 9/2010 | Den Boef et al. |
| 2010/0328655 A1 | 12/2010 | Den Boef |
| 2011/0026032 A1 | 2/2011 | Den Boef et al. |
| 2011/0102753 A1 | 5/2011 | Van De Kerkhof et al. |
| 2011/0249244 A1 | 10/2011 | Leewis et al. |
| 2012/0044470 A1 | 2/2012 | Smilde et al. |
| 2013/0162996 A1 | 6/2013 | Straaijer et al. |
| 2013/0304424 A1 | 11/2013 | Bakeman et al. |
| 2014/0019097 A1 | 1/2014 | Bakeman et al. |
| 2015/0261097 A1 | 9/2015 | Mathijssen et al. |
| 2016/0161863 A1 | 6/2016 | Den Boef et al. |
| 2016/0282282 A1 | 9/2016 | Quintanilha et al. |
| 2016/0370717 A1 | 12/2016 | Den Boef et al. |
| 2017/0184981 A1 | 6/2017 | Quintanilha et al. |
| 2020/0363573 A1 | 11/2020 | De Groot et al. |
| 2024/0410827 A1 * | 12/2024 | Maas ................ G03F 7/706847 |

FOREIGN PATENT DOCUMENTS

| | | | |
|---|---|---|---|
| EP | 3 276 419 A1 | 1/2018 | |
| EP | 3 361 315 A1 | 8/2018 | |
| EP | 3441820 A1 * | 2/2019 | ............ G01N 21/47 |
| TW | 2019-35088 A | 9/2019 | |
| TW | 2020-14805 A | 4/2020 | |
| TW | 2020-41973 A | 11/2020 | |
| WO | WO 2011/012624 A1 | 2/2011 | |
| WO | WO 2016/102127 A1 | 6/2016 | |

OTHER PUBLICATIONS

International Preliminary Report on Patentability directed to International Patent Application No. PCT/EP2021/078193, issued May 30, 2023; 6 pages.

Shcherbakov et al., "Generation of even and odd high harmonics in resonant metasurfaces using single and multiple ultra-intense laser pulses," Nature, vol. 12, Article No. 4185, Jul. 7, 2021; pp. 1-36.

Gauthier et al., "Orbital angular momentum from semiconductor high-order harmonics," Optics Letters, vol. 44, No. 3, Aug. 30, 2018; 5 pages.

Vampa et al., "Plasmon-enhanced high-harmonic generation from silicon," Nature Physics, vol. 13, Apr. 3, 2017; pp. 659-662.

Zhang et al., "Single-element laser beam shaper for uniform flat-top profiles," Optics Express, vol. 11, No. 16, Aug. 11, 2003; pp. 1942-1948.

Sivis et al., "Tailored semiconductors for high-harmonic optoelectronics," Science, vol. 357, No. 6348, Jul. 21, 2017; pp. 303-306.

Franz et al., "All semiconductor enhanced high harmonic generation from a single nano-structure," Scientific Reports, vol. 9, Article No. 5663, Apr. 5, 2019; 17 pages.

Franz et al., "Amplification of high harmonics in 3D semiconductor waveguides," Sep. 26, 2017; pp. 1-28.

Liu et al., "Enhanced high-harmonic generation from an all-dielectric metasurface," Nature Physics, vol. 14, Aug. 6, 2018; pp. 1006-1010.

Luu et al., "Extreme ultraviolet high-harmonic spectroscopy of solids," Nature, vol. 521, May 27, 2015; pp. 498-502.

Zhang Z., "Extreme-ultraviolet High-harmonic Generation from Structured Solids," ARCNL, retrieved Jun. 21, 2023; 18 pages.

* cited by examiner (a)

(b)

METROLOGY APPARATUS AND METROLOGY METHODS BASED ON HIGH HARMONIC GENERATION FROM A DIFFRACTIVE STRUCTURE

CROSS REFERENCE TO RELATED APPLICATIONS

This application claims priority of EP application 20209950.3 which was filed on 2020 Nov. 26 and which is incorporated herein in its entirety by reference.

FIELD

The present invention relates to methods and apparatus for metrology usable, for example, in the manufacture of devices by lithographic techniques.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, Such an apparatus may use a wavelength within the range 4-20 nm, for example 6.7 nm or 13.5 nm, to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field.

Examples of known scatterometers often rely on provision of dedicated metrology targets. For example, a method may require a target in the form of a simple grating that is large enough that a measurement beam generates a spot that is smaller than the grating (i.e., the grating is underfilled). In so-called reconstruction methods, properties of the grating can be calculated by simulating interaction of scattered radiation with a mathematical model of the target structure. Parameters of the model are adjusted until the simulated interaction produces a diffraction pattern similar to that observed from the real target.

In addition to measurement of feature shapes by reconstruction, diffraction-based overlay can be measured using such apparatus, as described in published patent application US2006066855A1. Diffraction-based overlay metrology using dark-field imaging of the diffraction orders enables overlay measurements on smaller targets. These targets can be smaller than the illumination spot and may be surrounded by product structures on a wafer. Examples of dark field imaging metrology can be found in numerous published patent applications, such as for example US2011102753A1 and US20120044470A. Multiple gratings can be measured in one image, using a composite grating target. The known scatterometers tend to use light in the visible or near-IR wave range, which requires the pitch of the grating to be much coarser than the actual product structures whose properties are actually of interest. Such product features may be defined using deep ultraviolet (DUV), extreme ultraviolet (EUV) or X-ray radiation having far shorter wavelengths. Unfortunately, such wavelengths are not normally available or usable for metrology.

On the other hand, the dimensions of modern product structures are so small that they cannot be imaged by optical metrology techniques. Small features include for example those formed by multiple patterning processes, and/or pitch-multiplication. Hence, targets used for high-volume metrology often use features that are much larger than the products whose overlay errors or critical dimensions are the property of interest. The measurement results are only indirectly related to the dimensions of the real product structures, and may be inaccurate because the metrology target does not suffer the same distortions under optical projection in the lithographic apparatus, and/or different processing in other steps of the manufacturing process. While scanning electron microscopy (SEM) is able to resolve these modern product structures directly, SEM is much more time consuming than optical measurements. Moreover, electrons are not able to penetrate through thick process layers, which makes them less suitable for metrology applications. Other techniques, such as measuring electrical properties using contact pads is also known, but it provides only indirect evidence of the true product structure.

By decreasing the wavelength of the radiation used during metrology (i.e. moving towards the "soft X-ray" wavelength spectrum), it is possible to resolve smaller structures, to increase sensitivity to structural variations of the structures and/or penetrate further into the product structures. One such method of generating suitably high frequency radiation (e.g., soft X-ray and/or EUV radiation) may be using a pump radiation (e.g., infra-red IR radiation) to excite a generating medium, thereby generating an emitted radiation, optionally a high harmonic generation comprising high frequency radiation.

However, once generated, delivering the resultant SXR/EUV radiation to the target presents difficulties as it is readily absorbed.

SUMMARY

In a first aspect of the invention, there is provided a metrology apparatus for measurement of a diffractive structure on a substrate, comprising: a radiation source operable to provide first radiation for excitation of the diffractive structure such that high harmonic second radiation is generated from said diffractive structure and/or substrate; and a detection arrangement operable to detect said second radiation, at least a portion of which having been diffracted by said diffractive structure.

In a second aspect of the invention, there is provided a method for measurement of a diffractive structure on a substrate, comprising: exciting the diffractive structure with first radiation to generate high harmonic second radiation from said diffractive structure and/or substrate; and detecting said second radiation, at least a portion of which having been diffracted by said diffractive structure.

BRIEF DESCRIPTION OF THE DRAWINGS

Embodiments will now be described, by way of example only, with reference to the accompanying schematic drawings, in which.

DETAILED DESCRIPTION

In the present document, the terms "radiation" and "beam" are used to encompass all types of electromagnetic radiation and particle radiation, including ultraviolet radiation (e.g. with a wavelength of 365, 248, 193, 157 or 126 nm), EUV (extreme ultra-violet radiation, e.g. having a wavelength in the range of about 5-125 nm or 5 to 100 nm), X-ray radiation, electron beam radiation and other particle radiation.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figures 1, 2:
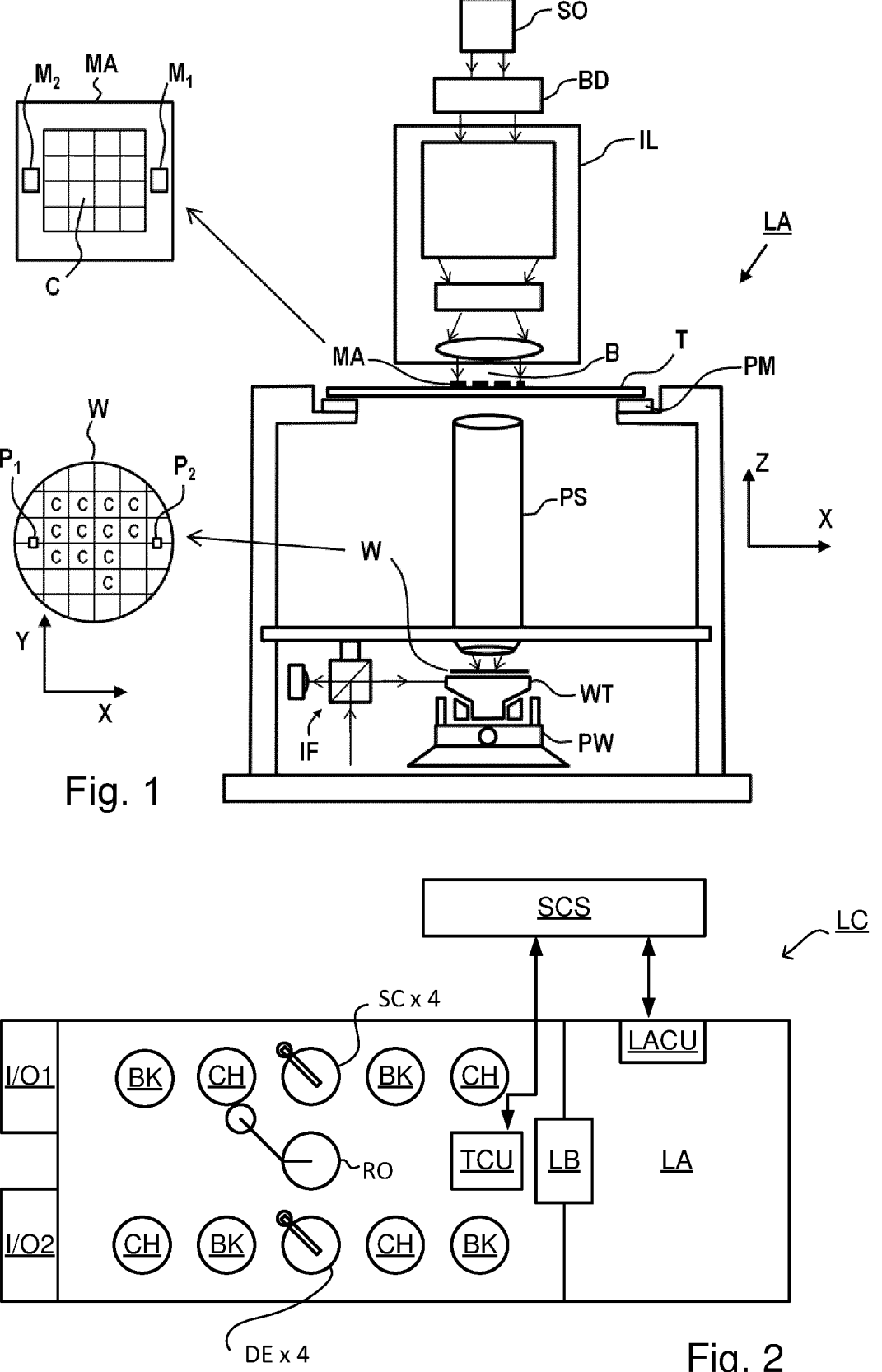
FIG. 1 depicts a schematic overview of a lithographic apparatus.
FIG. 2 depicts a schematic overview of a lithographic cell.

FIG. 1 schematically depicts a lithographic apparatus LA. The lithographic apparatus LA includes an illumination system (also referred to as illuminator) IL configured to condition a radiation beam B (e.g., UV radiation, DUV radiation, EUV radiation or X-ray radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, diffractive, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, diffractive, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference in its entirety.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT may be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, may be under the control of a track control unit TCU that in itself may be controlled by a supervisory control system SCS, which may also control the lithographic apparatus LA, e.g. via lithography control unit LACU.

In lithographic processes, it is desirable to make frequently measurements of the structures created, e.g., for process control and verification. Tools to make such measurement may be called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in an image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from hard X-ray, soft X-ray, extreme ultraviolet and visible to near-IR wavelength range. In case that the radiation is hard X-ray or soft X-ray, optionally with a wavelength ranging from 0.01 to 10 nm, the aforementioned scatterometers may optionally be a small-angle X-ray scattering metrology tool.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), shape of structures, etc. For this purpose, inspection tools and/or metrology tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected, transmitted or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered or transmitted radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920, 968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (maybe overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. The pitch and line-width of the structures in the gratings may strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Figures 3, 4:
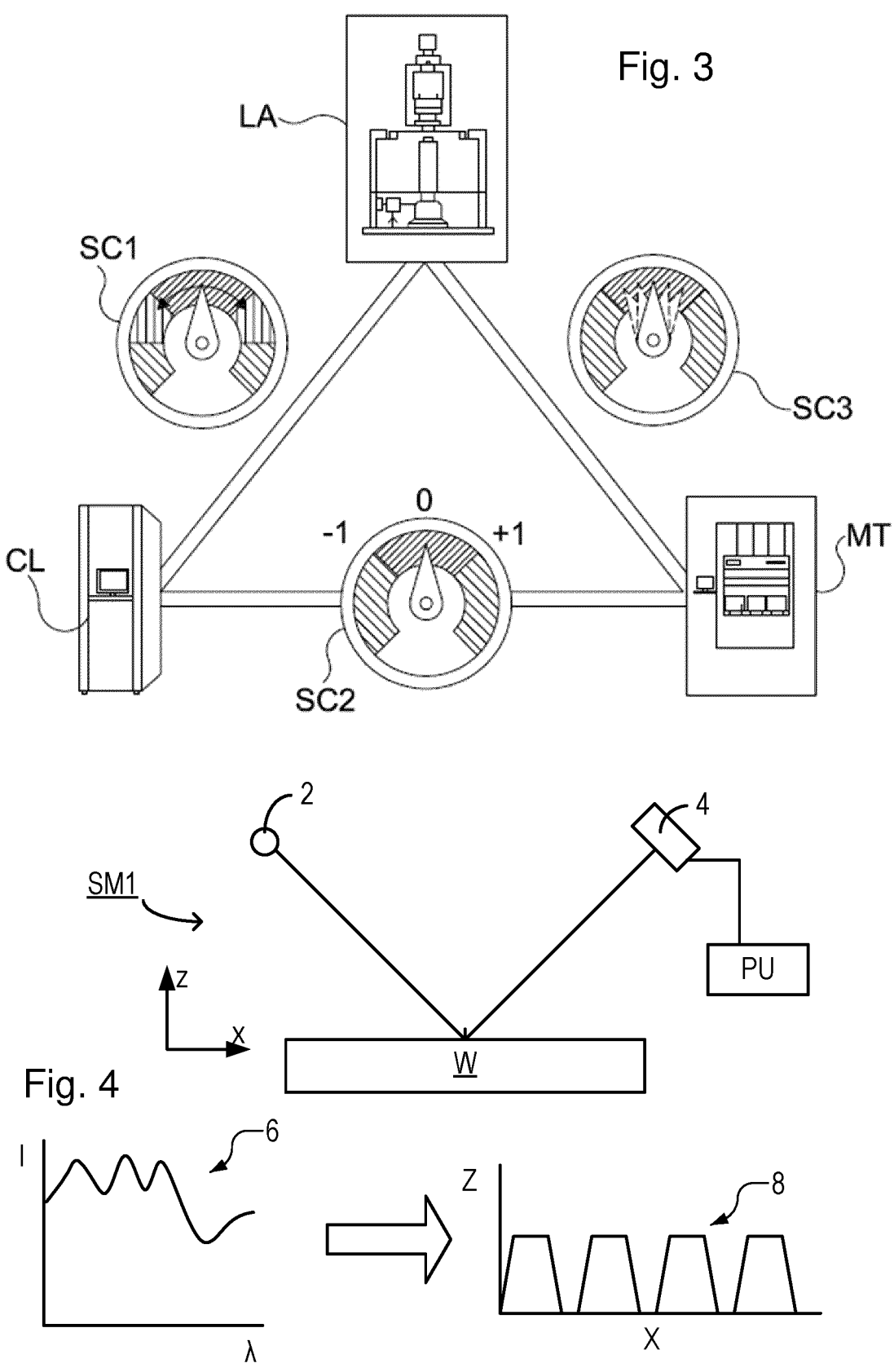
FIG. 3 depicts a schematic representation of holistic lithography, representing a cooperation between three key technologies to optimize semiconductor manufacturing.
FIG. 4 schematically illustrates a scatterometry apparatus.

The patterning process in a lithographic apparatus LA may be one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—maybe within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). The resolution enhancement techniques may be arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating may be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure in one image multiple targets from multiple gratings using light from hard X-ray, soft X-ray, extreme ultraviolet and visible to near-IR wave range.

One example of a metrology apparatus, such as a scatterometer, is depicted in FIG. 4. It may comprise a broadband (e.g. white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength λ) of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

As an alternative to optical metrology methods, it has also been considered to use hard X-ray, soft X-rays or EUV radiation, for example radiation in a wavelength range below 0.1 nm, or between 0.01 nm and 100 nm, or optionally between 1 nm and 50 nm or optionally between 10 nm and 20 nm. One example of metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. Reflectometry techniques using X-rays (GI-XRS) and extreme ultraviolet (EUV) radiation at grazing incidence are known for measuring properties of films and stacks of layers on a substrate. Within the general field of reflectometry, goniometric and/or spectroscopic techniques may be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

Figure 5:
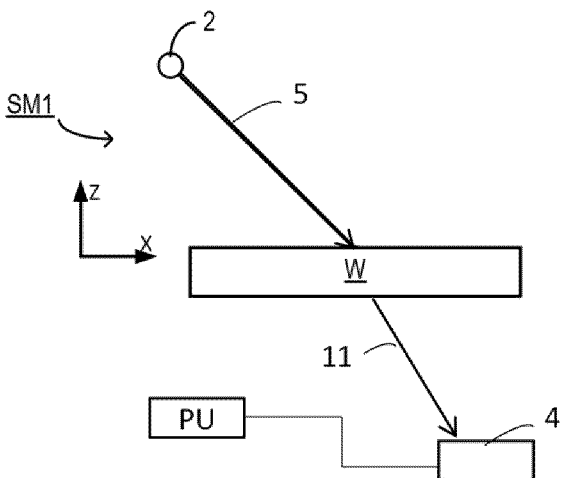
FIG. 5 depicts a schematic representation of a metrology apparatus in which EUV and/or SXR radiation is used.

A transmissive version of the example of a metrology apparatus, such as a scatterometer, shown in FIG. 4, is depicted in FIG. 5. The transmitted radiation 11 is passed to a spectrometer detector 4, which measures a spectrum 6 as discussed for FIG. 4. Such a scatterometer may be configured as a normal-incidence scatterometer or an oblique-incidence scatterometer.

It is possible that the range of application makes the use of wavelengths in e.g. the soft X-rays or EUV domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common. The contents of the cited US patent application are incorporated herein by reference in their entirety.

FIG. 5 depicts a schematic representation of a metrology apparatus 302 in which radiation in the wavelength range from 0.1 nm to 100 nm may be used to measure parameters of structures on a substrate. The metrology apparatus 302 presented in FIG. 5 is suitable for the soft X-rays or EUV domain.

FIG. 5 illustrates a schematic physical arrangement of a metrology apparatus 302 comprising a spectroscopic scatterometer using EUV and/or SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths.

Inspection apparatus 302 comprises a radiation source or called illumination source 310, illumination system 312, substrate support 316, detection systems 318, 398 and metrology processing unit (MPU) 320.

An illumination source 310 in this example is for a generation of EUV or soft x-ray radiation, which may be based on high harmonic generation (HHG) techniques. Main components of the radiation source are a pump radiation source 330 operable to emit the pump radiation and a gas delivery system 332. Optionally the pump radiation source 330 is a laser, optionally the pump radiation source 330 is a pulsed high-power infrared IR or visible laser. The pump radiation source 330 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). Optionally, the laser pulses are delivered as a first pump radiation 340 to the gas delivery system 332, where in the gas a portion of the radiation is converted to higher frequencies than the first radiation into an emitted radiation 342. A gas supply 334 supplies a suitable gas to the gas delivery system 332, where it is optionally ionized by an electric source 336. The gas delivery system 332 may be a cut tube which will be discussed in the later text.

The emitted radiation may contain multiple wavelengths. If the emitted radiation were monochromatic, then measurement calculations (for example reconstruction) may be simplified, but it is easier to produce radiation with several wavelengths. An emission divergence angle of the emitted radiation may be wavelength dependent. A gas provided by the gas delivery system 332 defines a gas target, which may be a gas flow or a static volume. The gas may be for example a noble gas such as neon (Ne), helium (He) or argon (Ar). N2, O2, Ar, Kr, Xe gases may all be considered. These may be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) or Zirconium (Zr) may serve to cut the fundamental IR radiation from passing further into the inspection apparatus. A grating (not shown) may be provided to select one or more specific harmonic wavelengths from among those generated. Some or all of the beam path may be contained within a vacuum environment, bearing in mind that SXR radiation is absorbed when traveling in air. The various components of radiation source 310 and illumination optics 312 may be adjustable to implement different metrology 'recipes' within the same apparatus. For example different wavelengths and/or polarization may be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 1-20 nm or optionally in the range 1-10 nm or optionally in the range 10-20 nm may be chosen. Wavelengths shorter than 5 nm may suffer from very low critical angle when reflecting off materials of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labeled T. The atmosphere within inspection chamber 350 is maintained near vacuum by vacuum pump 352, so that EUV radiation may pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above.

The focusing is performed to achieve a round or elliptical spot S under 10 µm in diameter, when projected onto the structure of interest. Substrate support 316 comprises for example an X-Y translation stage and a rotation stage, by which any part of the substrate W may be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise a soft X-ray and/or EUV spectroscopic reflectometer of the kind described in US2016282282A1 which content is incorporated herein by reference in its entirety.

If the target T has a certain periodicity, the radiation of the focused beam 356 may be partially diffracted as well. The diffracted radiation 397 follows another path at well-defined angles with respect to the angle of incidence then the reflected radiation 360. In FIG. 5, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 5 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the target T are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 may also communicate with a position controller 372 which operates the translation stage, rotation and/or tilting stages. Processor 320 receives highly accurate feedback on the position and orientation of the substrate, via sensors. Sensors 374 may include interferometers, for example, which may give accuracy in the region of picometers. In the operation of the inspection apparatus 302, spectrum data 382 captured by detection system 318 is delivered to metrology processing unit 320.

As mentioned an alternative form of inspection apparatus uses soft X-ray and/or EUV radiation at normal incidence or near-normal incidence, for example to perform diffraction-based measurements of asymmetry. Both types of inspection apparatus could be provided in a hybrid metrology system. Performance parameters to be measured may include overlay (OVL), critical dimension (CD), focus of the lithography apparatus while the lithography apparatus printed the target structure, coherent diffraction imaging (CDI) and at-resolution overlay (ARO) metrology. The soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 may be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

Metrology tools MT, including but not limited to the scatterometers mentioned above, may use radiation from a radiation source to perform a measurement. The radiation used by a metrology tool MT may be electromagnetic radiation. The radiation may be optical radiation, for example radiation in the infrared, visible, and/or ultraviolet parts of the electromagnetic spectrum. Metrology tools MT may use radiation to measure or inspect properties and aspects of a substrate, for example a lithographically exposed pattern on a semiconductor substrate. The type and quality of the measurement may depend on several properties of the radiation used by the metrology tool MT. For example, the resolution of an electromagnetic measurement may depend on the wavelength of the radiation, with smaller wavelengths able to measure smaller features, e.g. due to the diffraction limit. In order to measure features with small dimensions, it may be preferable to use radiation with a short wavelength, for example EUV and/or Soft X-Ray (SXR) radiation, to perform measurements. In order to perform metrology at a particular wavelength or wavelength range, the metrology tool MT requires access to a source providing radiation at that/those wavelength(s). Different types of sources exist for providing different wavelengths of radiation. Depending on the wavelength(s) provided by a source, different types of radiation generation methods may be used. For extreme ultraviolet (EUV) radiation (e.g. 1 nm to 100 nm), and/or soft X-ray (SXR) radiation (e.g. 0.1 nm to 10 nm), a source may use High Harmonic Generation (HHG) to obtain radiation at the desired wavelength(s). One of the challenges faced in the development of these sources is how to couple the emitted radiation out of the generating setup efficiently and separate the emitted radiation from the radiation used to drive the process.

Figure 6:
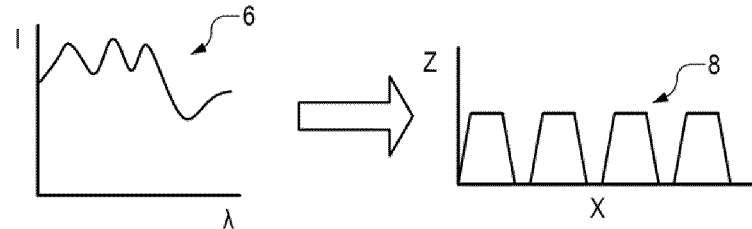
FIG. 6 depicts a schematic representation of a metrology apparatus in which EUV and/or SXR radiation is used adaptable using concepts disclosed herein.
Figure 6:
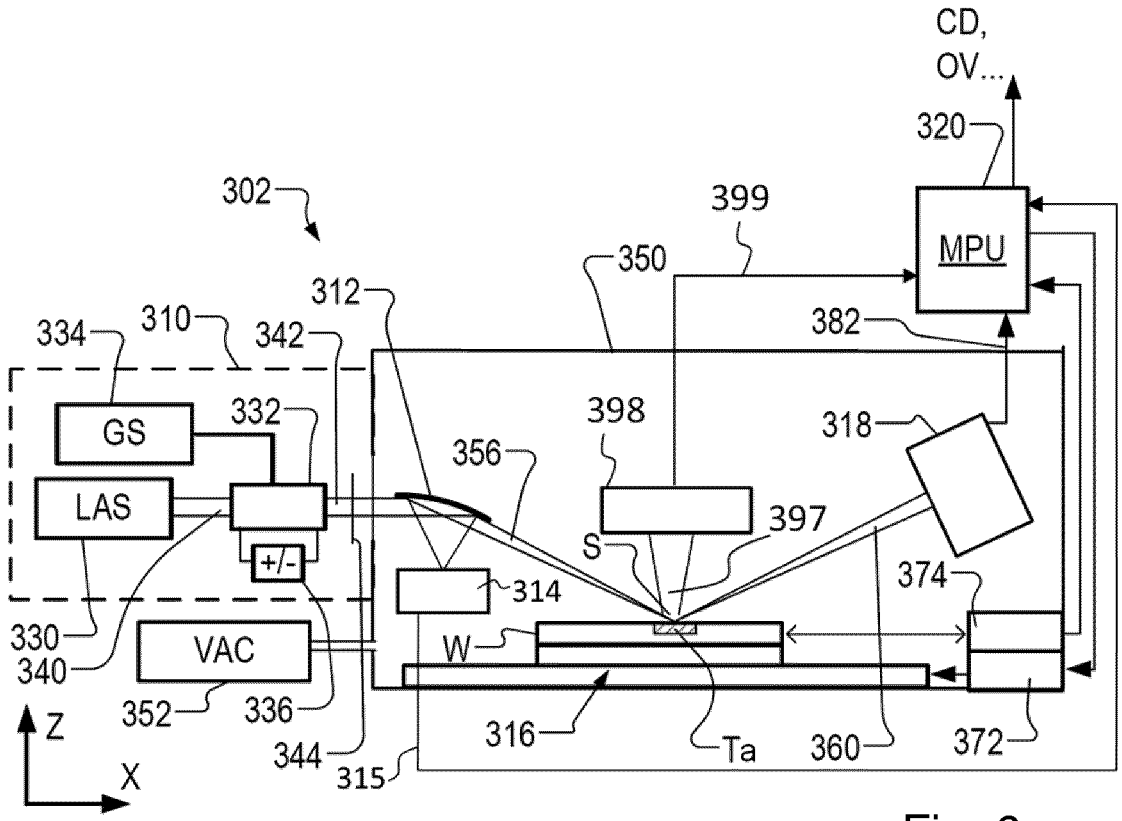

FIG. 6 shows a simplified schematic drawing of an embodiment 600 of an illumination source 310, which may be the illumination source for high harmonic generation. One or more of the features of the illumination source in the metrology tool described with respect to FIG. 5 may also be present in the illumination source 600 as appropriate. The illumination source 600 comprises a chamber 601. The illumination source 600 is configured to receive a pump radiation 611 with a propagation direction which is indicated by an arrow. The pump radiation 611 shown here is an example of the pump radiation 340 from the pump radiation source 330, as shown in FIG. 5. The pump radiation 611 may be directed into the chamber 601 through the radiation input 605, which maybe a viewport which may be made of fused silica or a comparable material. The pump radiation 611 may have a Gaussian or hollow, for example annular, transversal cross-sectional profile and may be incident, optionally focused, on a gas flow 615, which has a flow direction indicated by a second arrow, within the chamber 601. The gas flow 615 comprises a small volume (for example several cubic mm) of a particular gas (e.g., a noble gas, optionally Helium, Argon, or Neon, nitrogen, oxygen or carbon dioxide) in which the gas pressure is above a certain value. The gas flow 615 may be a steady flow. Other media, such as metallic plasmas (e.g. aluminium plasma) may also be used.

The gas delivery system of the illumination source 600 is configured to provide the gas flow 615. The illumination source 600 is configured to provide the pump radiation 611 in the gas flow 615 to drive the generation of emitted radiation 613. The region where at least a majority of the emitted radiation 613 is generated is called an interaction region. The interaction region may vary from several tens of micrometers (for tightly focused pump radiation) to several mm or cm (for moderately focused pump radiation) or even up to a few meters (for extremely loosely focused pump radiation). Optionally, the gas flow 615 is provided by the gas delivery system into an evacuated or nearly evacuated space. The gas delivery system comprises a gas nozzle 609, as shown in FIG. 6, which comprises an opening 617 in an exit plane of the gas nozzle 609. The gas flow 615 is provided from the opening 617. In almost all the prior arts, the gas nozzle has a cut tube geometry shape which is a uniform cylinder interior geometry shape, and the shape of the opening in the exit plane is round. An elongated opening has also been used as described in the patent application CN101515105B.

The dimensions of the gas nozzle 609 may conceivably also be used in scaled-up or scaled-down versions ranging from micrometer-sized nozzles to meter-sized nozzles. This wide range of dimensioning comes from the fact that the setup may be scaled such that the intensity of the pump radiation at the gas flow ends up in the particular range which may be beneficial for the emitted radiation, which requires different dimensioning for different pump radiation energies, which may be a pulse laser and pulse energies can vary from tens of microjoules to joules.

Due to interaction of the pump radiation 611 with the gas atoms of the gas flow 615, the gas flow 615 will convert part of the pump radiation 611 into the emitted radiation 613, which may be an example of the emitted radiation 342 shown in FIG. 5. The central axes of the emitted radiation 613 may be collinear with the central axes of the incident pump radiation 611. The emitted radiation 613 may have a wavelength in X-ray or EUV range, wherein the wavelength is in a range from 0.01 nm to 100 nm, optionally from 0.1 nm to 100 nm, optionally from 1 nm to 100 nm, optionally from 1 nm to 50 nm, or optionally from 10 nm to 20 nm.

In operation the emitted radiation 613 beam may pass through a radiation output 607 and may be subsequently manipulated and directed by an illumination system 603, which may be an example of the illumination system 312 in FIG. 5, to a wafer to be inspected for metrology measurements. The emitted radiation 613 may be guided, optionally focused, to a target on the wafer.

Because air (and in fact any gas) heavily absorbs SXR or EUV radiation, the volume between the gas flow 615 and the wafer to be inspected may be evacuated or nearly evacuated. Since the central axes of the emitted radiation 613 may be collinear with the central axes of the incident pump radiation 611, the pump radiation 611 may need to be blocked to prevent it passing through the radiation output 607 and entering the illumination system 603. This may be done by incorporating a filtering device 344 shown in FIG. 5 into the radiation output 607, which is placed in the emitted beam path and that is opaque or nearly opaque to the driving radiation (e.g. opaque or nearly opaque to infrared or visible light) but at least partially transparent to the emitted radiation beam. The filter may be manufactured using zirconium. The filter may be a hollow, optionally an annular, block when the pump radiation 611 has a hollow, optionally an annular, transversal cross-sectional profile.

Described herein are methods, apparatuses, and assemblies to obtain emitted radiation optionally at a high harmonic frequency of pump radiation. The radiation generated through the process, optionally the HHG which uses non-linear effects to generate radiation at a harmonic frequency of provided pump radiation, may be provided as radiation in metrology tools MT for inspection and/or measurement of substrates. The substrates may be lithographically patterned substrates. The radiation obtained through the process may also be provided in a lithographic apparatus LA, and/or a lithographic cell LC. The pump radiation may be pulsed radiation, which may provide high peak intensities for short bursts of time.

The pump radiation 611 may comprise radiation with one or more wavelengths higher than the one or more wavelengths of the emitted radiation. The pump radiation may comprise infrared radiation. The pump radiation may comprise radiation with wavelength(s) in the range of 800 nm to 1500 nm. The pump radiation may comprise radiation with wavelength(s) in the range of 900 nm to 1300 nm. The pump radiation may comprise radiation with wavelength(s) in the range of 100 nm to 1300 nm. The pump radiation may be pulsed radiation. Pulsed pump radiation may comprise pulses with a duration in the femtosecond range.

For some embodiments, the emitted radiation, optionally the high harmonic radiation, may comprise one or more harmonics of the pump radiation wavelength(s). The emitted radiation may comprise wavelengths in the extreme ultra-violet (EUV), soft X-Ray (SXR), and/or hard X-Ray part of the electromagnetic spectrum. The emitted radiation 613 may comprise wavelengths in the range of 0.01 nm to 100 nm. The emitted radiation 613 may comprise wavelengths below 0.1 nm. The emitted radiation 613 may comprise wavelengths in the range of 0.1 nm to 100 nm. The emitted radiation 613 may comprise wavelengths in the range of 0.1 nm to 50 nm. The emitted radiation 613 may comprise wavelengths in the range of 1 nm to 50 nm. The emitted radiation 613 may comprise wavelengths in the range of 10 nm to 20 nm.

Radiation, such as high harmonic radiation described above, may be provided as source radiation in a metrology tool MT. The metrology tool MT may use the source radiation to perform measurements on a substrate exposed by a lithographic apparatus. The measurements may be for determining one or more parameters of a structure on the substrate. Using radiation at shorter wavelengths, for example at EUV and/or SXR wavelengths as comprised in the wavelength ranges described above, may allow for smaller features of a structure to be resolved by the metrology tool, compared to using longer wavelengths (e.g. visible radiation, infrared radiation). Radiation with shorter wavelengths, such as EUV and/or SXR radiation, may also penetrate deeper into a material such as a patterned substrate, meaning that metrology of deeper layers on the substrate is possible. These deeper layers may not be accessible by radiation with longer wavelengths.

In a metrology tool MT, source radiation may be emitted from a radiation source and directed onto a target structure (or other structure) on a substrate. The source radiation may comprise EUV and/or SXR radiation. The target structure may reflect and/or diffract the source radiation incident on the target structure. The metrology tool MT may comprise one or more sensors for detecting diffracted radiation. For example, a metrology tool MT may comprise detectors for detecting the positive (+1st) and negative (−1st) first diffraction orders. The metrology tool MT may also measure the specular reflected radiation (0th order diffracted radiation). Further sensors for metrology may be present in the metrology tool MT, for example to measure further diffraction orders (e.g. higher diffraction orders).

SXR metrology using HHG techniques partially resolve the problem of limited penetration depth of visible/NIR wavelength into the relevant materials, due to the larger penetration depth of SXR. It is also an all-optical method, thus measurements can be sufficiently fast for metrology in a high volume manufacturing environment, for example. However, handling HHG sources is technologically challenging. Furthermore, the setups are inflexible, as there are no good materials for SXR reflection, beam shaping etc. leading to a loss of photons. These problems limit the possibilities and/or increase production costs for precise fabrication and inspection of nanolithographic multilayer structures.

Therefore, methods and apparatuses are proposed herein which directly generate high harmonic second radiation from the measured diffractive structure; e.g., a metrology target on a wafer. This can be achieved by illuminating the sample with first radiation e.g., comprising sufficiently short radiation pulses (e.g., on the femtosecond order of magnitude), such as laser pulses, and measuring the high harmonic emission resulting from excitation of the sample by the radiation pulses.

The use of SXR, XUV and/or EUV HHG tools (e.g., in the wavelength range of 1-100 nm or 30-100 nm) is typically motivated by the desire to perform (e.g., overlay) metrology at-resolution (e.g., metrology on structures of similar dimensions as product structures or directly on the product structure). Here it is proposed that the high harmonics may be generated directly from an at-resolution overlay diffractive structure. An overlay diffractive structure may comprise, for example, at least first and second diffractive sub-structures (which may be similar in parameters such as pitch, or different) in respective layers. In this case, the drive laser wavelength can be larger than the pitch of the overlay target, provided that the emitted wavelength of at least one of the harmonics is smaller than the grating pitch. This has the advantage that there is no requirement for an expensive advanced HHG setup for SXR beam generation, guiding and refocusing. Also, there is no requirement for an expensive high peak-power driving laser, which enables the use of lasers with higher repetition rates. This is because HHG from solids can be obtained using laser peak intensities which are one to two orders of magnitude lower than that required for gas-phase HHG used in present SXR metrology tools.

Figure 8:
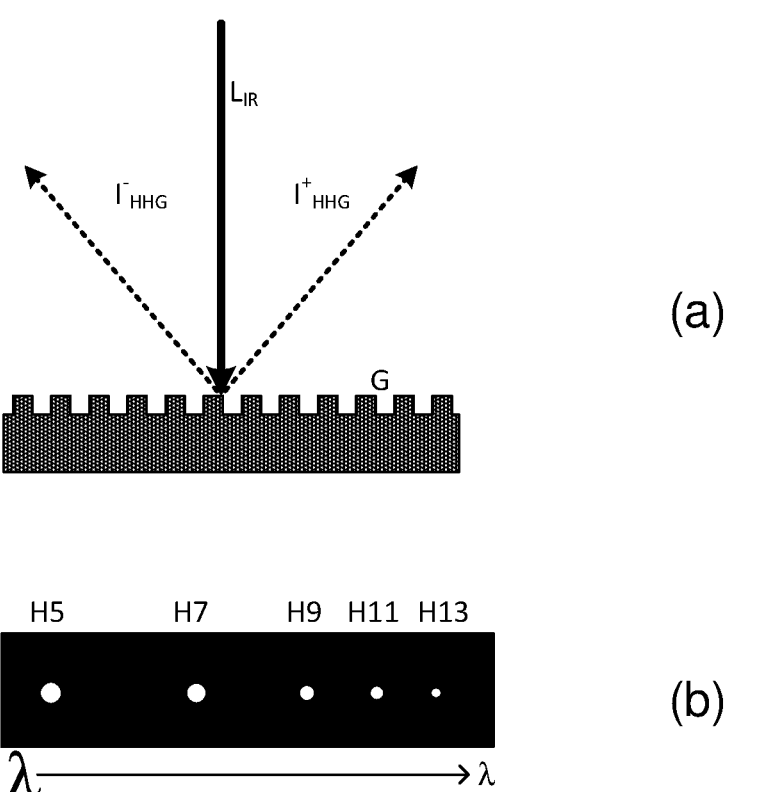
FIG. 8 (a) schematically depicts the concept of diffractive high harmonic generation from a metrology target; and (b) the captured diffraction orders, according to an embodiment.

FIG. 8 schematically illustrates the concept. FIG. 8(*a*) shows laser radiation (pulsed) $L_{IR}$ being incident on a grating G formed on a substrate. The wavelength of this laser radiation may be sufficiently large with respect to the pitch of grating G such that it is not itself diffracted. However, the excitation of the grating and/or substrate material results in HHG emission $$I_{HHG}^{+1}, I_{HHG}^{-1}$$

which is diffracted by the grating G. Note that while only the +1 and −1 orders are shown here, other diffracted HHG higher orders and a HHG zeroth order will also be generated (the latter may be blocked or detected, in the latter case it may be filtered to remove the laser radiation, depending on the imaging mode (e.g., dark field or bright field)). FIG. 8(b) illustrates the +1 diffraction order as captured on a detector with zeroth order blocked (here captured directly, although intervening optics may of course be used to capture and image these diffraction orders on a detector). Here five harmonics are shown: odd harmonics between the fifth and thirteenth harmonics H5, H7, H9, H11, H13. These emitted harmonics have wavelengths in the range of 160 nm (H5) to 62 nm (H13) in the example shown below, but smaller generated harmonic wavelengths are possible, e.g., 30 nm or shorter. As such, methods described herein may generate radiation with wavelengths shorter than 200 nm, shorter than 160 nm, shorter than 130 nm, shorter than 100 nm, shorter than 80 nm, shorter than 70 nm, shorter than 50 nm, shorter than 40 nm or shorter than 30 nm.

To generate harmonics from various semiconductor device materials, tunable femtosecond drivers may be used with wavelength output, for example, tunable between 100 to 3000 nm, 400 to 3000 nm or 800 to 3000 nm. Such wavelength tunability can be achieved with optical parametric amplifiers (OPA). Presently, Titanium:Saphhire lasers are available to pump OPAs to create tunable femtosecond pulses from 200 nm to 20 μm. Harmonics as high as the 30th order, i.e. 1/30 of the fundamental driving wavelength can be generated from solids, which may have wavelengths as short as 30 nm. Such short wavelength emission from metrology targets will be desirable for a number of applications, including:

Obtaining increased diffraction efficiency of short wavelength light for alignment gratings;

At-resolution metrology from overlay targets;

Direct imaging of complex periodic and aperiodic structures with a resolution determined by the wavelength of the emitted harmonics, rather than that of the infrared drive laser;

Height measurements of gratings or other (e.g., periodic) structures.

More complex structures than grating-based targets can be measured using the diffractive emission techniques disclosed herein. The diffractively emitted short-wavelength radiation may be directly detected, and can measure at a resolution determined by the emitted wavelength and the detection numerical aperture (NA).

To illustrate this, an emission pattern of a grid sample (e.g., a double grating comprising with lines oriented 90 degrees with respect to each other) was captured and a phase retrieval reconstruction performed. The phase retrieval algorithm converged on an image which is almost identical to an optical microscope image of the sample. Such concepts can be extended to more complex samples and structures.

It is also proposed that height measurement may also be performed based on the concept of generating the measurement radiation (e.g., EUV radiation) from the measured sample. If EUV radiation is generated on the structured surface of a grating, the structures imprint a phase front given by the height profile of the grating onto the emitted EUV radiation. In the far field this leads to zeroth and diffracted orders. The spectrally resolved diffraction efficiency; i.e., the relative intensity of a diffracted order (e.g., a first order) with respect to the zeroth order, for multiple harmonic orders generated can reveal the height profile. For example, a phase difference of pi between emission from the top of a line and emission from the bottom of a groove/trough would lead to maximum diffraction efficiency and no emission in the zero order; therefore determining the height can be achieved by accurately determining the wavelength for which the diffraction efficiency is maximum (e.g., for which the zeroth order is minimum). The accuracy of such a height measurement is only limited by the spectral resolution and spectral coverage of the emission.

Figure 9:
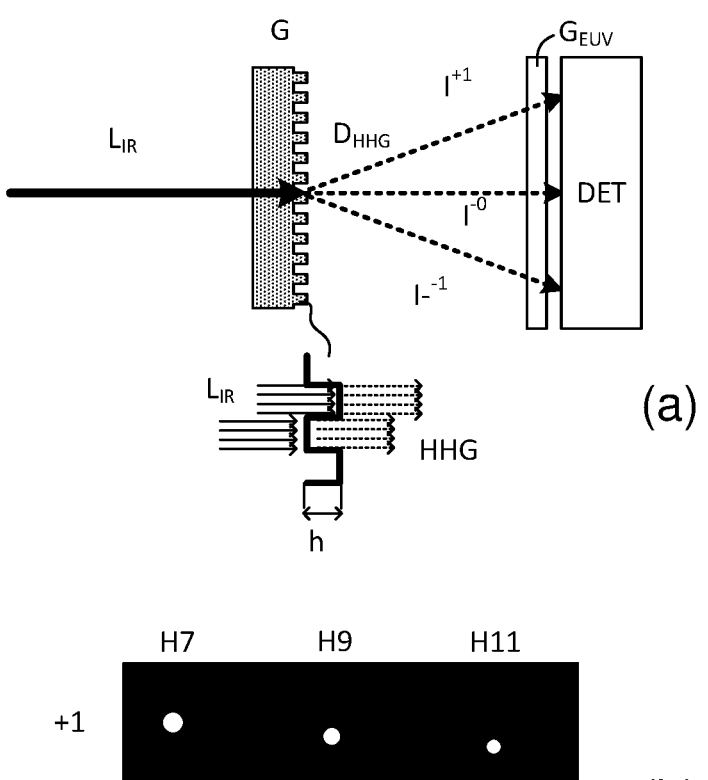
FIG. 9 (a) schematically depicts an arrangement for height measurement of a metrology target using diffractive high harmonic generation from the target; and (b) the captured diffraction orders, according to an embodiment.
Figure 10:
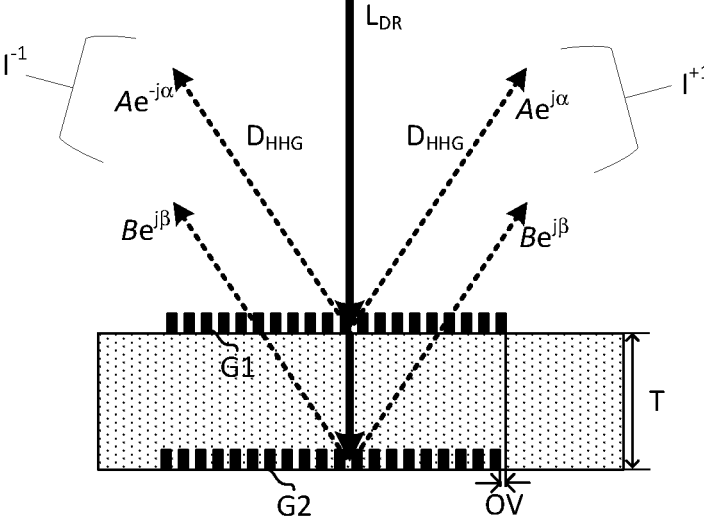
FIG. 10 schematically depicts the concept of overlay measurement based on diffractive high harmonic generation from a metrology target.

FIG. 9(a) is a schematic illustration of an arrangement suitable for height detection. Note that this is a simplified drawing for clarity, which depicts excitation by drive radiation illuminating the backside of the target. Typically, in the majority of actual metrology applications, illumination will be from the front side (though backside illumination is also within the scope of this disclosure), such as depicted in FIGS. 8 and 10. The (e.g., IR) laser radiation excites a grating G of height h resulting in HHG diffraction $D_{HHG}$ comprising at least one higher order having intensities $I^{+1}$, $I^{-1}$ and the zeroth order having intensity $I^0$. The emitted HHG diffraction $D_{HHG}$ was subsequently spectrally resolved with an EUV grating GEUV in the direction of the detector plane perpendicular to the direction of diffraction. FIG. 9(b) shows the detected +1, zeroth and −1 orders for three harmonics H7, H9, H11. It can be seen that for Harmonic H9 (e.g., 89 nm), the zeroth order is suppressed (faint), and for Harmonic H11 (e.g., 73 nm) virtually no zeroth order is detected. Knowing that such a situation corresponds to a phase difference of pi, the height of the grating can be calculated.

The above paragraph describes an example of an experimental setup rather than the general method (in which for example wavelengths and diffraction orders may differ) which illustrates the basic principal behind grating height extraction using the techniques herein. However, a more practical and/or accurate grating height determination method may comprise determining the intensities of +1 and/or −1 diffraction orders (or other higher diffraction orders) and the zeroth diffraction order and using these in a single-parameter fit to extract the height. In particular, a relation between the phase difference $\Delta\varphi$ and the intensity of the first diffraction order $I_1$ and zeroth diffraction order $I_0$ can be derived, which allows direct extraction of the average height h of the grating elements, for each EUV wavelength $\lambda_{EUV}$, and knowing the refractive index of the infrared driving pulses $n_{IR}$:

$$\Delta\varphi = 2 * \tan^{-1}\left(\frac{\pi}{2} * \sqrt{\frac{I_1}{I_0}}\right)$$

$$h = \frac{\Delta\varphi * \lambda_{EUV}}{2\pi * (n_{IR} - 1)}$$

Therefore, using the example of FIG. 9(b) the zeroth order of harmonic 11 (72.7 nm) is completely suppressed, which gives a phase difference of $\Delta\varphi = \pi$ and a grating height h of 81 nm. Improved accuracy (e.g., sub-nm accuracy of height profile measurements) may be obtained by increasing EUV spectral coverage (e.g., by employing shorter driving pulses, longer wavelengths, or wavelength-tunable drivers) and combining this with a high-resolution and well calibrated spectrometer.

The above treatment holds for micron-pitched gratings, where the pitch is larger than the driving wavelength which generates the HHG. For smaller-pitched gratings, field concentration in the structures (which are now smaller than the driving wavelength) also plays a role, and the effect of the grating can no longer be described as a pure phase modulation. However, a more advanced measurement can be performed to extract the phase of the emission, which will now be described in the context of overlay metrology.

One of the major challenges in current overlay metrology is to perform overlay measurements on structures with the same size (e.g., pitch, critical dimension) as the structures in the integrated circuits, such that the targets correlate better with the actual device. Solid HHG can be employed to achieve this.

FIG. 10 schematically illustrates the concept. An (e.g., infrared) drive laser beam $L_{DR}$ is incident onto an overlay metrology target comprising a first grating G1 and second grating G2. The overlay target comprises a pitch in the order of tens of nm, such that it acts as a sub wavelength grating for the IR radiation, and diffracts the generated EUV radiation $D_{HHG}$. The first grating G1 produces +1, −1 diffraction orders, the phase α of which depends on overlay OV (in this specific example) and grating pitch P, more specifically:

$$\alpha = 2\pi \frac{OV}{P}$$

Note that the phase α is not generally dependent on overlay as the radiation emitted by the first grating is independent from the second grating. More generally the phase of the radiation from the first grating is dependent on a position P1 of the lines with respect to the incident laser beam. The above dependence on overlay is a direct consequence position P1 being implicitly expressed as P2+OV, where P2 is the position of the lines of the second grating with respect to the laser beam, and where, for simplicity, position P2 has been taken to be zero (which can be done without loss of generality, because the value of P2 does not influence the observed quantity ΔI).

The drive laser radiation (for example, but not exclusively, IR radiation) remains unaffected and is transmitted to the second grating G2, where it again generates further +1, −1 diffraction orders, the phase β of which depends on layer thickness T, the wavelength of the drive laser radiation $\lambda_{DR}$ and the emitted harmonic order HO (where the wavelength emitted harmonic order $\lambda_{EUV}=\lambda_{DR}/HO$), more specifically:

$$\beta = 2\pi \frac{T}{\lambda_{DR}}(1 + HO)$$

The detected intensity $I^{+1}$, $I^{-1}$ of the first diffracted orders from both gratings depend on their interference, which is given through their relative phases, that are directly sensitive to the overlay OV, as shown in the equations:

$$I^{+1} = \left|Ae^{j\alpha} + Be^{j\beta}\right|^2 = A^2 + B^2 + 2AB\cos(\beta - \alpha)$$

-continued
$$I^{-1} = \left|Ae^{-j\alpha} + Be^{j\beta}\right|^2 = A^2 + B^2 + 2AB\cos(\beta + \alpha)$$

$$\Delta I = 4AB \times \sin(\beta)\sin(\alpha) \approx 8\pi \frac{AB}{P}\sin\left(2\pi \frac{T}{\lambda_{DR}}(1 + HO)\right) * OV$$

$$\text{or: } \Delta I = K * OV; K = 8\pi \frac{AB}{P}\sin\left(2\pi \frac{T}{\lambda_{DR}}(1 + HO)\right)$$

where K is the overlay sensitivity and parameters A and B represent the amplitude of the interfering waves. As such, using conventional processing techniques to deal with the overlay sensitivity (e.g., biased targets) the overlay can be extracted.

FIG. 10 illustrates a normal incidence for the laser drive radiation $L_{DR}$; however other angles of incidence are possible and may be beneficial as the reflectivity and diffraction efficiencies of extreme ultraviolet light would be very low for normal incidence. Adaption of the above treatment for non-normal incidence is trivial for the skilled person.

Besides the advantage of measuring on structures which correlate better to the actual device, the broadband nature of HHG ensures that optimum overlay sensitivity K is achieved, i.e., an oscillatory function which depends on both wavelength and thickness.

Note that overlay is only one parameter which can be measured via an intensity difference of complementary higher orders (e.g., +1 and −1 orders). Other parameters of interest can be measured via an intensity difference of complementary higher orders such as focus (measurement of special targets which are exposed with a focus dependent asymmetry). Positional parameters (alignment) can also be measured via this intensity difference.

The proposed concepts may be realised as a new metrology tool. However it is also possible to integrate the concepts within an existing gas-phase HHG SXR based metrology tool such as illustrated in FIG. 6 as this may be more cost-efficient and commercially simpler.

Figure 7:
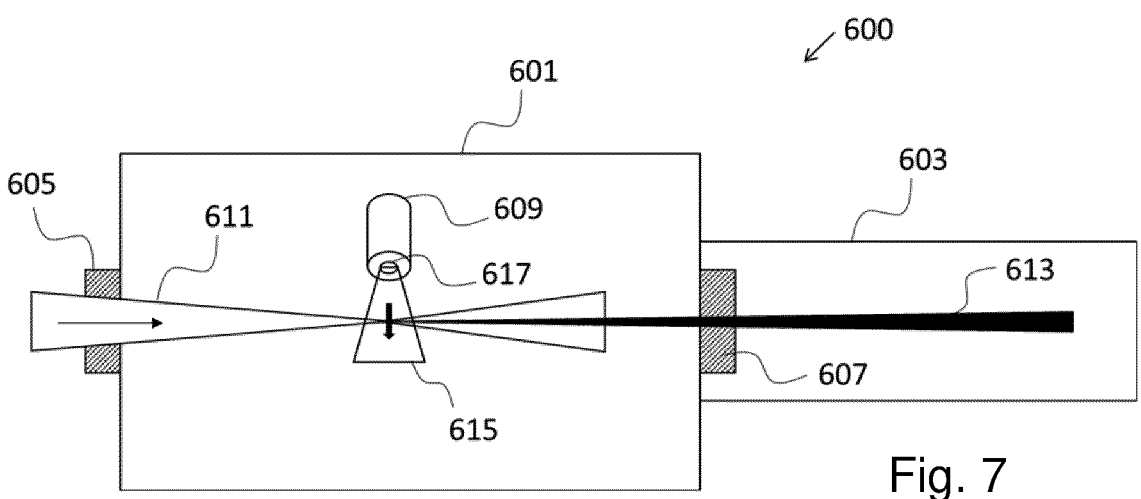
FIG. 7 depicts a schematic representation of an illumination source for high harmonic generation adaptable using concepts disclosed herein.

For example, a source such as illustrated in FIG. 7 may be used, but with the HHG gas target bypassed (e.g., by preventing the gas flow), and removing the filters for infrared removal. In this manner the IR beam can propagate all the way to the metrology target (e.g., via the same radiation delivery optics), where direct metrology by HHG emission from the structure can be performed.

Alternatively, the gas-filled HHG target may be retained in place, such that only the filter is removed. This would enable illumination of the metrology target with both HHG from the gas (third radiation), and HHG generated from the metrology target itself (second radiation). Subsequently the interference of the third radiation, reflected/diffracted from the metrology target, and the second radiation directly generated (and reflected/diffracted) from the target can be recorded. This interference from the two different HHG radiations may provide a phase sensitive measurement, instead of only measuring the amplitude of the diffraction. Three ways to perform such a phase sensitive measurement are proposed:

a) By carefully characterizing the phase of the third radiation (this is relatively well known, and can also be obtained from theory or alternative measurements) and measuring the spectra of gas and solid HHG independently, the phase of the second radiation from the sample can be retrieved.

b) By exchanging one of the gas-HHG reflection mirrors in the setup with a split mirror, where the center part reflects the less divergent HHG, and the outer part the IR, a delay scan can be performed to actually measure the interference of second and third radiations.

c) By routing part of the infrared beam around the gas HHG target and adjusting its delay with a high-precision translation stage, the third radiation beam can be delayed with respect to the infrared beam, which subsequently generates HHG from the metrology target.

Such interferometric measurements enable access to the phase of the metrology-target emission, which is directly linked to its height profile. Combined with the coherent diffractive emission from the target, this would enable a full 3D reconstruction of the sample. As a standalone measurement, it would allow mapping out the height profile. In contrast to the height measurements disclosed above, for gratings with pitches larger than the driving wavelength, such an interferometric height measurement could be performed on any grating including those having a pitch smaller than the wavelength of the driving wavelength. The measurement of phase can also be used in positional or alignment applications for measurement of alignment.

On the sensor, crosstalk between IR and EUV radiation may be a problem, in particular if the IR is powerful and is not filtered out. Therefore it is proposed that the IR may be filtered out. Most of the measured structures (metrology targets or product structures) are diffracting structures, and IR and EUV will diffract to different angles. Some of the measured structures are subwavelength for the IR and thus will not diffract IR at all. If the 0th order reflected from the substrate does not have to be detected then IR can be blocked out with a beam dump (zero order stop). To improve contrast, or if the zeroth is to be detected, a thin metal filter (e.g., 100 nm Al for 20-70 eV) can block the IR, while transmitting a large fraction of the EUV.

Drive laser radiation, which may comprise IR radiation, may illuminate the environment causing e.g., ablation problems. In general all measurements are done below the damage threshold. The light that illuminates the environment will likely be order(s) of magnitude less intense than the peak intensity used to generate high harmonic in the metrology structures. Provided that the surrounding structures do not have orders of magnitude smaller damage threshold, IR illumination might still be acceptable. In one embodiment, the overlay measurement should not be affected by the IR, as the light detected for overlay are the high harmonics (EUV) and the sensor can be made "blind" to IR by directly protecting it with a suitable metal filter (such as described).

Penetration into a wafer for some wavelengths described herein (e.g., 60 nm) is low. For the underlying grating this may result in insufficient overlay data being received. That may be avoided by the careful and appropriate selection/optimization of the combination of material/driving wavelength/emitted wavelength. For example, in silicon, the attenuation length is shorter at 30 eV (40 nm) than at 60 eV (20 nm), but longer than at 120 eV (10 nm).

If the stack is transparent or partially transparent to the IR radiation, overlay data may be extracted even if the generated EUV radiation would not be able to penetrate into the stack. In that situation, the IR field at the top of the stack will still be modified by the light returning from the bottom grating, as in a normal overlay measurement. If the EUV radiation is generated by the resultant combined field, it would then still contain overlay information. Near-field couplings may be needed to perform such an overlay measurement on sub-IR-wavelength pitches.

In principle many materials will emit high harmonics, but not necessarily in the EUV spectral range. Wide band-gap dielectrics (SiO2, Al2O3, MgO) have been shown to emit up to 40 eV (30 nm), Semiconductors (Si) also emit high harmonics but seem to be restricted to the near-UV (<10 eV). Almost any material will generate high harmonics, but not necessarily in the same wavelength range (which affects the smallest possible pitch that can be used). Therefore pitches which can be measured with the current state-of-the art is >30 nm (given by the so-far shortest reported emitted wavelength of 30 nm). Most materials will be able to emit up to 300 nm, so with pitches on that order almost any material can be used as diffractive emission target.

In summary, described herein are methods for generating high harmonics directly from metrology targets on a wafer and measurement of high harmonics generated directly from metrology targets. Phase-resolved measurement of high harmonics generated directly from metrology targets is also disclosed, by interfering metrology target-generated harmonics with harmonics from a reference gas-HHG source. The proposals enable at-resolution metrology and/or EUV imaging with all optical light sources. Improved methods of 3D metrology target reconstruction and determination of height profiles of metrology targets are described. Direct overlay metrology on targets with the same dimensions as the features in the printed circuits can be performed without the need to separately generate EUV light that illuminates the sample.

The disclosed concepts may be integrated into existing HHG SXR based tool, or developed into an independent tool which may be more compact and potentially cheaper than a gas-phase tool.

The above disclosed concepts may be used in the context of metrology for lithography control, for example to measure one or more of: overlay, focus, critical dimension, and other profilometry parameters.

Although specific reference is made to HHG emission from a structure on a substrate, it should be noted that the above-mentioned metrology apparatus as well as the methods may be practiced with other types of radiation emissions from the structure on the substrate: a further embodiment is an apparatus, optionally a metrology apparatus, comprising a radiation source operable to provide a first radiation for excitation of a structure, for example a diffractive structure, such that a second radiation is generated from said structure and/or substrate; and a detection arrangement operable to detect said second radiation, optionally at least a portion of which having been diffracted by said structure. Optionally, the second radiation has a different wavelength than the first radiation. Optionally, the second radiation has a smaller wavelength than the first radiation. Optionally, the second radiation has a larger wavelength than the first radiation.

The illumination source may be provided in for example a metrology apparatus MT, an inspection apparatus, a lithographic apparatus LA, and/or a lithographic cell LC.

The properties of the emitted radiation used to perform a measurement may affect the quality of the obtained measurement. For example, the shape and size of a transverse beam profile (cross-section) of the radiation beam, the intensity of the radiation, the power spectral density of the radiation etc., may affect the measurement performed by the radiation. It is therefore beneficial to have a source providing radiation that has properties resulting in high quality measurements.

Further embodiments are disclosed in the subsequent numbered clauses:

1. A metrology apparatus for measurement of a diffractive structure on a substrate for control of a lithography process, comprising:

a radiation source operable to provide first radiation for excitation of the diffractive structure such that high harmonic second radiation is generated from said diffractive structure and/or substrate; and a detection arrangement operable to detect said second radiation, at least a portion of which having been diffracted by said diffractive structure.

2. A metrology apparatus as claimed in clause 1, wherein the first radiation is laser radiation.

3. A metrology apparatus as claimed in clause 1 or 2, wherein the first radiation is pulsed radiation.

4. A metrology apparatus as claimed in clause 3, wherein the length of each pulse is in the range of 1 fs to 500 fs 5. A metrology apparatus as claimed in any preceding clause, wherein the first radiation comprises a wavelength in the range of 100 nm to 3000 nm.

6. A metrology apparatus as claimed in clause 5, wherein the radiation source is tunable to select a wavelength between 100 to 3000 nm.

7. A metrology apparatus as claimed in any preceding clause, wherein at least some harmonics of said second radiation comprise wavelengths shorter than 200 nm.

8. A metrology apparatus as claimed in any preceding clause, wherein at least some harmonics of said second radiation comprise wavelengths shorter than 100 nm.

9. A metrology apparatus as claimed in any preceding clause, wherein at least some harmonics of said second radiation comprise wavelengths shorter than 70 nm.

10. A metrology apparatus as claimed in any preceding clause, comprising a dispersive element being operable to spectrally resolve the second radiation on said detection arrangement.

11. A metrology apparatus as claimed in any preceding clause, being operable to determine a ratio of an intensity of a zeroth order and an intensity from at least one higher diffraction order of the second radiation; and use said ratio to determine a height of the diffractive structure in the direction perpendicular to the substrate plane.

12. A metrology apparatus as claimed in any preceding clause, being operable to determine critical dimension and/or one or more other profilometry parameters from said second radiation.

13. A metrology apparatus as claimed in any preceding clause, being operable to detect intensities of a pair of complementary higher diffraction orders of said second radiation; and determine a parameter of interest from a difference of said intensities.

14. A metrology apparatus as claimed in clause 13, wherein the diffractive structure is formed in at least two layers and the parameter of interest is overlay.

15. A metrology apparatus as claimed in clause 13, wherein the parameter of interest is focus or alignment.

16. A metrology apparatus as claimed in any preceding clause, comprising a high harmonic generation source comprising a gas source for generating a gas medium thereby being able to generate high harmonic third radiation from excitation of the gas medium by said first radiation; and radiation delivery optics for delivering the third radiation to a structure on the substrate.

17. A metrology apparatus as claimed in clause 16, wherein the metrology apparatus is configured such that said gas medium is disabled and said first radiation is directly transported to said diffractive structure via said radiation delivery optics.

18. A metrology apparatus as claimed in any preceding clause, comprising a first radiation filter or zero order block to filter out said first radiation between said substrate and said detection arrangement.

19. A metrology apparatus as claimed in clause 16, wherein the high harmonic generation source is operable to generate said third radiation such that said detection arrangement is configured to detect both said second radiation and said third radiation, at least a portion of said second radiation and said third radiation having been diffracted by said diffractive structure.

20. A metrology apparatus as claimed in clause 19, being operable to determine interference between said second radiation and third radiation; and determine the phase of said second radiation from said interference.

21. A metrology apparatus as claimed in clause 20, being operable to determine a height of the diffractive structure using said phase.

22. A metrology apparatus as claimed in clause 20 or 21, being operable to perform a three-dimensional reconstruction of said diffractive structure using said phase.

23. A metrology apparatus as claimed in clause 21, being operable to determine an aligned position from said phase.

24. A metrology apparatus as claimed in any of clauses 20 to 23, comprising a split mirror comprising a first region which reflects the third radiation, and a second region which reflects the first radiation; and being operable to perform a delay scan to measure said interference of second radiation and third radiation.

25. A metrology apparatus as claimed in any of clauses 20 to 24, comprising a controllable delay stage being operable to control a delay of the third radiation with respect to the first radiation.

26. A metrology apparatus as claimed in any preceding clause, wherein said structure comprises a structure formed by a lithographic process on a semiconductor substrate.

27. A metrology apparatus as claimed in any preceding clause, being configured such that the first radiation is incident on and the second radiation is emitted from the same side of said substrate.

28. A method for measurement of a diffractive structure on a substrate, comprising:

exciting the diffractive structure with first radiation to generate high harmonic second radiation from said diffractive structure and/or substrate; and detecting said second radiation, at least a portion of which having been diffracted by said diffractive structure to obtain a measured data;

wherein the measured data is used for control of a lithography process.

29. A method as claimed in clause 28, wherein the first radiation is laser radiation.

30. A method as claimed in clause 28 or 29, wherein the first radiation is pulsed radiation.

31. A method as claimed in clause 30, wherein the length of each pulse is in the range of 1 fs to 500 fs 32. A method as claimed in any of clauses 28 to 31, wherein the first radiation comprises a wavelength in the range of 100 nm to 3000 nm.

33. A method as claimed in any of clauses 28 to 32, wherein at least some harmonics of said second radiation comprise wavelengths shorter than 200 nm.

34. A method as claimed in any of clauses 28 to 32, wherein at least some harmonics of said second radiation comprise wavelengths shorter than 100 nm.

35. A method as claimed in any of clauses 28 to 32, wherein at least some harmonics of said second radiation comprise wavelengths shorter than 70 nm, optionally shorter than 30 nm.

36. A method as claimed in any of clauses 28 to 35, comprising spectrally resolving the second radiation on said detection arrangement.

37. A method as claimed in any of clauses 28 to 36, comprising:

determining a ratio of an intensity of a zeroth order and an intensity from at least one higher diffraction order of the second radiation; and using said ratio to determine a height of the diffractive structure in the direction perpendicular to the substrate plane.

38. A method as claimed in any of clauses 28 to 37, comprising determining critical dimension and/or one or more other profilometry parameters from said second radiation.

39. A method as claimed in any of clauses 28 to 38, comprising detecting intensities of a pair of complementary higher diffraction orders of said second radiation; and determining a parameter of interest from a difference of said intensities.

40. A method as claimed in clause 39, wherein the diffractive structure is formed of at least a first diffractive sub-structure and a second diffractive sub-structure in respective different layers and the parameter of interest is overlay.

41. A method as claimed in clause 39, wherein the parameter of interest is focus or alignment.

42. A method as claimed in any of clauses 28 to 41, wherein the wavelength of said first radiation is larger than an effective pitch of said diffractive structure.

43. A method as claimed in clause 42, wherein the wavelength of said first radiation is at least an order of magnitude larger than an effective pitch of said diffractive structure such that said first radiation is not diffracted by said diffractive structure.

44. A method as claimed in any of clauses 28 to 43, wherein the wavelength of said second radiation is of the same order of magnitude of an effective pitch of said diffractive structure.

45. A method as claimed in any of clauses 28 to 44, wherein the wavelength of said second radiation is of the same order of magnitude as a critical dimension of said diffractive structure.

46. A method as claimed in any of clauses 28 to 45, comprising providing said first radiation via a high harmonic generation source which generates high harmonic third radiation from excitation of a gas medium by said first radiation.

47. A method as claimed in clause 46, wherein the gas medium is disabled and the first radiation is directly transported to said diffractive structure via radiation delivery optics of the high harmonic generation source.

48. A method as claimed in any of clauses 28 to 47, comprising filtering out or blocking said first radiation between said substrate and said detection arrangement.

49. A method as claimed in clause 46, comprising generating said third radiation such that said detection arrangement is configured to detect both said second radiation and said third radiation, at least a portion of said second radiation and said third radiation having been diffracted by said diffractive structure.

50. A method as claimed in clause 49, comprising interference between said second radiation and third radiation; and determining the phase of said second radiation from said interference.

51. A method as claimed in clause 50, comprising determining a height of the diffractive structure using said phase.

52. A method as claimed in clause 50 or 51, comprising performing a three-dimensional reconstruction of said diffractive structure using said phase.

53. A method as claimed in clause 51, comprising determining an aligned position from said phase.

54. A method as claimed in any of clauses 50 to 53, comprising performing a delay scan to measure said interference of second radiation and third radiation.

55. A method as claimed in any of clauses 50 to 54, comprising controlling a delay of the third radiation with respect to the first radiation.

56. A metrology apparatus as claimed in any preceding clause, wherein said structure comprises a structure formed by a lithographic process on a semiconductor substrate.

57. A metrology apparatus as claimed in any preceding clause, being configured such that the first radiation is incident on and the second radiation is emitted from the same side of said substrate.

58. A lithographic cell comprising a metrology apparatus according to any of clauses 1 to 27, 56 and 57.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments in the context of a lithographic apparatus, embodiments may be used in other apparatus. Embodiments may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Although specific reference may be made in this text to embodiments in the context of an inspection or metrology apparatus, embodiments may be used in other apparatus. Embodiments may form part of a mask inspection apparatus, a lithographic apparatus, or any apparatus that measures or processes an object such as a wafer (or other substrate) or mask (or other patterning device). The term "metrology apparatus" (or "inspection apparatus") may also refer to an inspection apparatus or an inspection system (or a metrology apparatus or a metrology system). E.g. the inspection apparatus that comprises an embodiment may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch of the metrology targets may be close to the resolution limit of the optical system of the scatterometer or may be smaller, but may be much larger than the dimension of typical non-target structures optionally product structures made by lithographic process in the target portions C. In practice the lines and/or spaces of the overlay gratings within the target structures may be made to include smaller structures similar in dimension to the non-target structures.

While specific embodiments have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference is made to SXR and EUV electromagnetic radiations, it will be appreciated that the invention, where the context allows, may be practiced with all electromagnetic radiations, includes radio waves, microwaves, infrared, (visible) light, ultraviolet, X-rays, and gamma rays. As an alternative to optical metrology methods, it has also been considered to use X-rays, optionally hard X-rays, for example radiation in a wavelength range between 0.01 nm and 10 nm, or optionally between 0.01 nm and 0.2 nm, or optionally between 0.1 nm and 0.2 nm, for metrology measurements.

The invention claimed is:

1. A metrology apparatus for measurement of a diffractive structure on a substrate for control of a lithography process, comprising:
   a radiation source configured to provide a first radiation for excitation of the diffractive structure such that high harmonic second radiation is generated from the diffractive structure and/or substrate;
   a detection system configured to detect the second radiation, at least a portion of that having been diffracted by the diffractive structure; and
   a processor configured to use the second radiation to determine a parameter of the diffractive structure or a parameter of the lithographic process.

2. The metrology apparatus of claim 1, wherein the first radiation is pulsed radiation.

3. The metrology apparatus of claim 2, wherein a length of each pulse is in the range of 1 fs to 500 fs.

4. The metrology apparatus of claim 1, wherein the first radiation comprises a wavelength in the range of 100 nm to 3000 nm.

5. The metrology apparatus of claim 1, wherein at least some harmonics of the second radiation comprise wavelengths shorter than 200 nm.

6. The metrology apparatus of claim 1, further comprises a dispersive element configured to spectrally resolve the second radiation on the detection system.

7. The metrology apparatus of claim 1, wherein the processor is further configured to determine a ratio of an intensity of a zeroth order and an intensity from at least one higher diffraction order of the second radiation; and
   use the ratio to determine a height of the diffractive structure in the direction perpendicular to the substrate plane.

8. The metrology apparatus of claim 1, wherein the processor is further configured to determine overlay, focus, alignment, critical dimension and/or one or more other profilometry parameters from the second radiation.

9. The metrology apparatus of claim 1, wherein the radiation source comprises:
   a high harmonic generation source comprising a gas source for generating a gas medium thereby is able to generate high harmonic third radiation from excitation of the gas medium by the first radiation; and
   radiation delivery optics for delivering the third radiation to a structure on the substrate.

10. The metrology apparatus of claim 9, wherein the high harmonic generation source is operable to generate the third radiation such that the detection system is configured to detect both the second radiation and the third radiation, at least a portion of the second radiation and the third radiation having been diffracted by the diffractive structure.

11. The metrology apparatus of claim 10, wherein the processor is further configured to determine interference between the second radiation and third radiation; and determine the phase of the second radiation from the interference.

12. The metrology apparatus of claim 1, wherein the diffractive structure comprises a structure formed by a lithographic process on a semiconductor substrate.

13. The metrology apparatus of claim 1, wherein the metrology apparatus is configured such that the first radiation is incident on and the second radiation is emitted from the same side of the substrate.

14. A method for measurement of a diffractive structure on a substrate, comprising:
   exciting the diffractive structure with first radiation to generate high harmonic second radiation from the diffractive structure and/or substrate; and
   detecting the second radiation, at least a portion of that having been diffracted by the diffractive structure to obtain a measured data,
   wherein the measured data corresponding to the second radiation is used to determine a parameter of the diffractive structure or to control a lithography process.

15. A lithographic cell comprising a metrology apparatus for measurement of a diffractive structure on a substrate for control of a lithography process, comprising:
   a radiation source configured to provide first radiation for excitation of the diffractive structure such that high harmonic second radiation is generated from the diffractive structure and/or substrate;

a detection system configured to detect the second radiation, at least a portion of that having been diffracted by the diffractive structure; and a processor configured to use the second radiation to determine a parameter of the diffractive structure or a parameter of the lithographic process.

16. The metrology apparatus of claim 1, wherein at least some harmonics of the second radiation comprise wavelengths shorter than 100 nm.

17. The metrology apparatus of claim 1, wherein at least some harmonics of the second radiation comprise wavelengths shorter than 70 nm.

18. The metrology apparatus of claim 1, wherein at least some harmonics of the second radiation comprise wavelengths shorter 30 nm.

* * * * *